United States Patent [19]

Davis et al.

[11] Patent Number: 4,679,250
[45] Date of Patent: Jul. 7, 1987

[54] OPTICAL REPEATERS

[75] Inventors: Aurthur A. Davis, Harrold Wood; Robert W. Eady, London, both of England

[73] Assignee: Standard Telephones and Cables plc, London, England

[21] Appl. No.: 692,394

[22] Filed: Jan. 18, 1985

[30] Foreign Application Priority Data

Jan. 19, 1984 [GB] United Kingdom ............ 8401432

[51] Int. Cl.⁴ .................................................. H04B 9/00
[52] U.S. Cl. ............................ 455/601; 165/80.3; 174/16 HS; 174/70 S; 361/386
[58] Field of Search .................. 375/3; 455/601, 612; 361/386, 388, 395, 399; 174/16 AS, 70 S; 165/80.1, 80.2, 80.3

[56] References Cited

U.S. PATENT DOCUMENTS

| 4,528,615 | 7/1985 | Perry | 361/386 |
| 4,547,833 | 10/1985 | Sharp | 361/386 |

FOREIGN PATENT DOCUMENTS

| 56-154839 | 11/1981 | Japan | 455/601 |
| 58-121842 | 7/1983 | Japan | 455/601 |
| 1201452 | 8/1970 | United Kingdom. | |
| 2086141 | 10/1980 | United Kingdom. | |
| 2100064 | 10/1982 | United Kingdom. | |
| 2058484 | 3/1983 | United Kingdom. | |
| 2152297 | 7/1985 | United Kingdom. | |
| 2153159 | 8/1985 | United Kingdom. | |

OTHER PUBLICATIONS

Runge et al., Future Undersea Lightwave Communication, Signal, Jun. 1983, pp. 30-35.
Gupta, Air Cooled Chip Conduction Module, IBM Tech Discl. Bull., vol. 21, No. 2, Jul. 1978, pp. 747, 748.
Antonetti, Compliant Cold Plate, IBM Tech. Discl. Bulletin, vol. 21, No. 6, Nov. 1978, p. 2431.

Primary Examiner—Joseph A. Orsino, Jr.
Attorney, Agent, or Firm—Kerkam, Stowell, Kondracki & Clarke

[57] ABSTRACT

An optical repeater for a submersible transmission system has a steel housing and a modular assembly carrying the electronic and opto-electronic components. Each module (20) of the assembly has heat conductive electrically insulating devices (30 to 33) secured to the periphery of the module (20) and embracing the inner surface of the housing (1). Each device comprises a resiliently biassed metal element (44).

6 Claims, 7 Drawing Figures

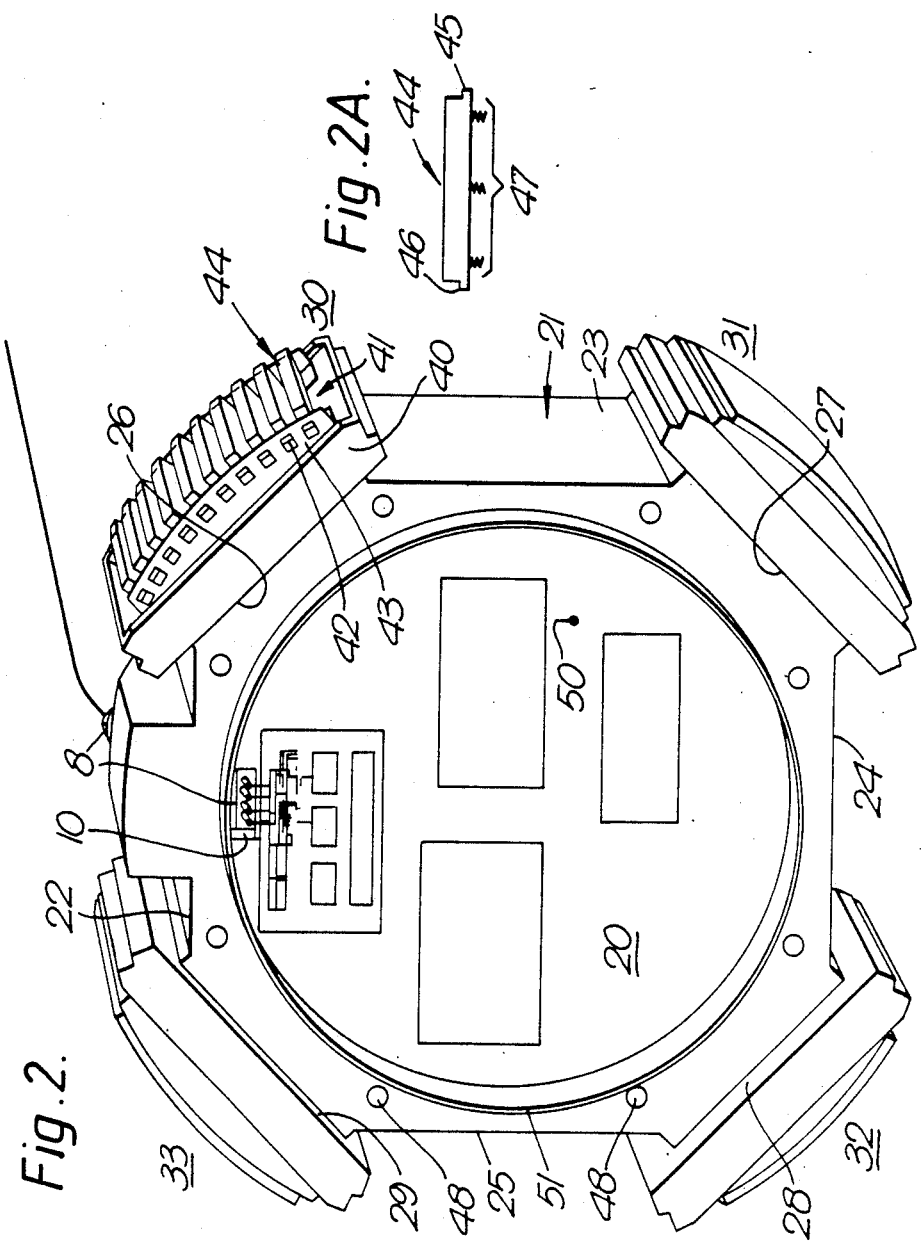

OPTICAL REPEATERS

BACKGROUND OF THE INVENTION

This invention relates to repeaters for regenerating the signal in a digital undersea transmission system.

With the advent of high speed digital optical systems it is important to ensure that the opto-electronic components are maintained at an even temperature; in particular a semiconductor laser for launching light into the optical fibre has an operational life dependent upon temperature, and so its temperature needs to be kept low to ensure a maximum operational life. It is also important to prevent ingress of gas and moisture and to maintain adequate screening between channels in the repeater.

DISCUSSION OF THE PRIOR ART

British Patent Specification No. 1201452 discloses stacked electric circuit constructions in which spring tongues make edge contact with the internal surface of a housing. The single edge contact provides poor heat conduction. Furthermore the tongues are integrated with a plate which forms part of the stack, making hermetic sealing of the electrical circuits difficult.

The insulation resistance of the epoxy by which circuits are insulated from the plate would withstand only low voltages e.g. tens of volts.

It is one object of the present invention to provide a digital repeater with a cooling arrangement with high insulation resistance to tend to maintain the opto-electronic components at a low temperature, and which overcomes the difficulties of the prior art.

SUMMARY OF THE INVENTION

According to the present invention there is provided a digital repeater comprising an outer housing, a chassis within the housing, electrical and opto-electronic components supported on the chassis, means for maintaining the chassis at a d.c. level different from the housing in use of the repeater, and a heat transfer arrangement comprising an electrically insulating heat transfer device located between the chassis and the housing and maintaining electrical insulation between the chassis and the housing, said heat transfer device comprising a resiliently-biassed metallic element.

BRIEF DESCRIPTION OF THE DRAWINGS

In order that the invention can be clearly understood reference will now be made to the accompanying drawings in which

FIG. 2 shows in perspective part of FIG. 1 on an enlarged scale,

FIG. 2A shows a detail of FIG. 2.

DESCRIPTION OF THE PREFERRED EMBODIMENT

Figure 1:
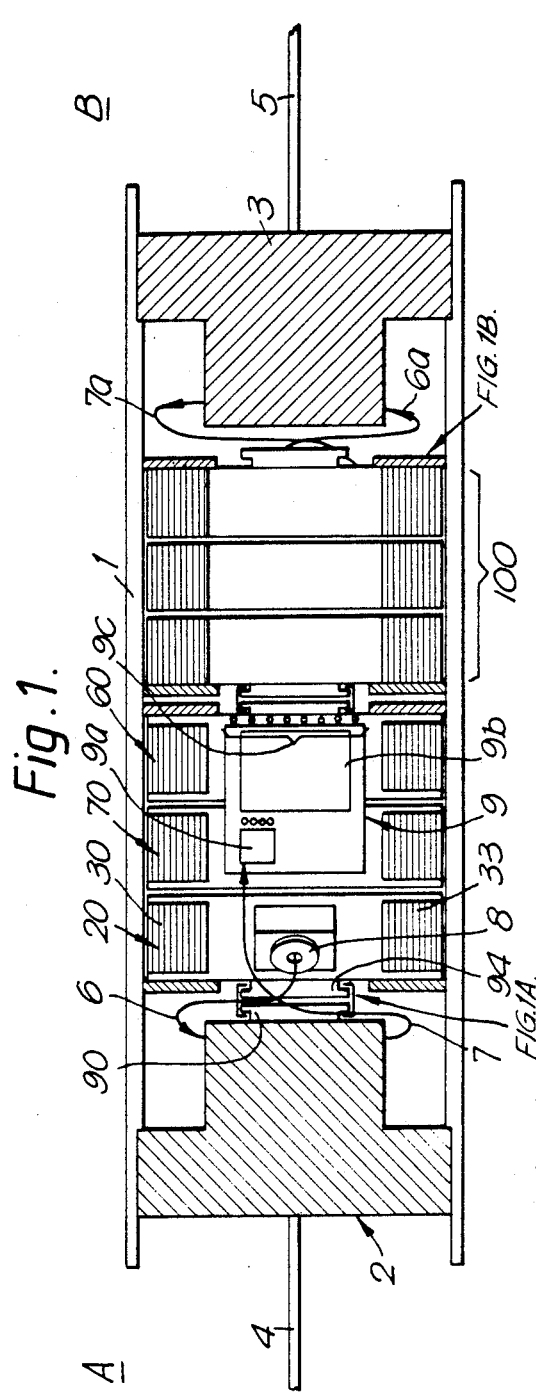
FIG. 1 shows part of an optical repeater according to an embodiment of the present invention.

Referring to FIG. 1 the undersea repeater comprises a pressure resistant metal housing 1 made of steel sealed by bulkheads 2 and 3 at each end. Through the bulkheads are sealed and secured respective fibre optic cables 4 and 5 which also have a power conductor for providing electrical power to the repeater to power the circuitry. The technique by which the cable, power conductor and fibres are sealed through the bulkhead together with other aspects of the repeater are described in our co-pending British Patent Application Nos. 2058484, 8401447 and 8401433.

The bulkheads 2 and 3 each contain a sealed chamber (not shown), in which the optical fibres 6 and 7 are spliced and the fibres extend from the chamber through the bulkhead radially or radially and circumferentially and follow a gently curved path into a longitudinal direction towards the semiconductor injection laser in its package 8 and the PIN FET diode 9a and receive amplifier 9b in an assembly 9. Both packages and assemblies are hermetically sealed. The laser package 8 is sealed into an aperture 10 inclined towards the longitudinal axis of the repeater and more easily seen in FIG. 2, and the assembly 9 has interconnection leads 9c extending between the receive amplifier 9b and casing 21, and hermetically sealed in both.

Referring to FIG. 2 there is shown a transmit and receive module 20 comprising a metal casing 21 having eight sides around its circumference. Four of the sides 22, 23, 24 and 25 provide for electrical and optical connections, either interconnections between this module and the adjacent or co-operating module, or input and output power and optical signal connections to and from the sea cable 4 or 5. The other four sides 26, 27, 28 and 29 support electrically insulating thermally conductive resilient heat transfer devices 30, 31, 32 and 33 which provide a good heat transfer path between the module and the metal housing 1.

Each heat transfer device such as 30 comprises a box-like part 40 made of heat conductive electrically insulating material such as alumina, the underside of part 40 being secured e.g. by heat-conductive glue, to face 26. Inside the box-like part 40 is seated a channel shaped part 41 of brass with slots 42 in the side walls 43 of the channel 41. The part 41 is in good heat transfer connection with the base of box 40. A number of transverse metal slats such as 44 have two lugs 45 and 46 which locate in the opposed slot 42 and metal springs 47 urge the slats 44 outwards. The surface of the slats 44 or at least the two longitudinal edges will bear against the inside surface of the housing 1 when the module is located in the housing 1, slightly compressing the springs 47.

The function of the heat transfer devices such as 30 is to ensure that the temperature of the electronic components and particularly the laser diode rises as little as possible above the ambient temperature of the repeater housing 1 which on the seabed will normally be close to 4° C. except in tropical areas or where strong currents flow.

The interior of the casing 21 is divided into two regions by an integral wall 50. Thus on the side of the module 20 hidden from view is a circular chamber corresponding to the one which is visible but over twice as deep. The visible chamber houses the transmit circuitry; the hidden chamber houses the receive circuitry and supervisory circuitry. The integral wall ensures good screening between the transmit and receive parts of the circuitry. The module is closed and sealed hermetically by welding or soldering a metal lid on each side to a rim such as 51 on the module casing 21 with an inert clean atmosphere locked inside.

On the face 24 of the module casing, diametrically opposite the laser package 8, will be mounted a PIN FET diode and receive amplifier assembly similar to the assembly 9 shown in FIG. 1. This will receive the signal from the direction B to A in fibre 7a and the laser package 8 transmits the regenerated signal in the same direction via fibre 6. The arrows on the fibre indicate the signal direction.

The regenerator module 60 shown in FIG. 1 is similar to module 20 in all respects except that it receives and transmits in the direction A to B via fibres 7 and 6a respectively and the supervisory circuit will respond to provide a loop back condition in response to a different signal compared with module 20.

In between the two modules 20 and 60 is a power module 70 which receives power from the cable 4 and zener diodes are used to pick off a voltage for powering the adjacent modules 20 and 60. In other respects the structure of module 70 is the same as 60 and 20.

Figure 1B:
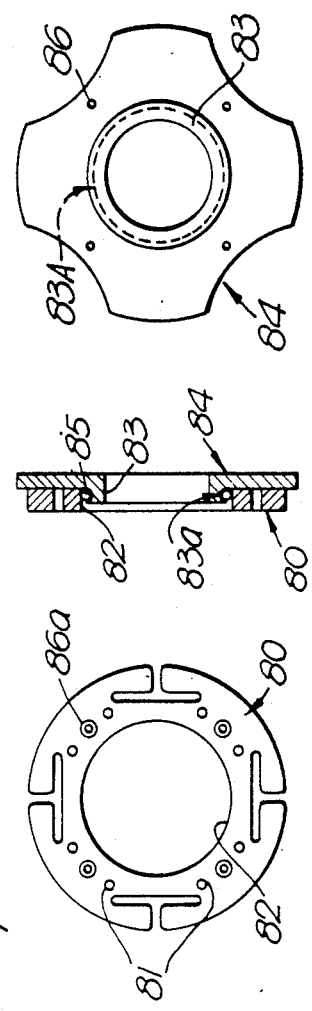
FIGS. 1A and 1B show details of FIG. 1, not necessarily on the same scale.

The three modules 20, 60 and 70 are clamped together to form a modular assembly by bolts (not shown) passing through holes such as 48 (FIG. 2) and cylindrical spacers on the bolts and between the modules. At each end there is clamped (FIG. 1B) an insulating plastics plate 80 with holes 81 corresponding to holes 48. Plate 80 has an annular hole 82 which at the right hand end co-operates with an annular projection 83 on a second insulating plastics or glass fibre plate 84 to hold a resilient 'O' ring 85 between them. Projection 83 has an annular recess 83a in which the "O" ring 85 partially sits. Screws secured in holes such as 86 in plate 84 locate in holes 86a in plate 80 to secure this plate to plate 80 but with freedom for limited radial but not axial relative movement between the plates against the resilience of the 'O' ring 85 and such that the resilient heat transfer devices are not damaged by overcompression during shock loading on the housing. The plate 84 is a sliding fit inside the repeater housing 1 whereas plate 80 has a smaller overall diameter, and the 'O' ring 85 acts as a resilient radial support for the modular assembly 20, 60, 70 at the right hand end. Further the assembly is locked to the end flange 90 of the bulkhead 2 by a rubber ring 91 having two internal grooves 92, 93 into which fit the peripheries of flange 90 and the flange 94 of module 20 (flange 94 is not shown in FIG. 2 but is secured to the casing 21). An annular metal clamping ring 95 is secured over the rubber ring 91 to resiliently lock the modular assembly to the bulkhead in an axial direction and in the radial direction.

Figure 1A:
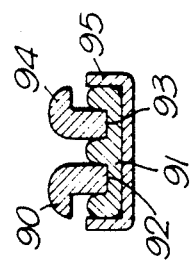

The modular assembly described provides regeneration for a fibre pair in the cable 4 and 5 for both directions. A second modular assembly indicated generally by reference numeral 100 is similar to the one just described and provides regeneration for a second fibre pair in the cable. The two modular assemblies are locked together by a rubber ring 91 and clamp 95 in the same way as the first modular assembly is locked to the bulkhead 2 and as shown in FIG. 1A.

In the embodiment shown in FIG. 1 there are illustrated just two modular assemblies for two fibre pairs. In practice the repeater housing 1 could accommodate more such assemblies depending on the number of fibre pairs in the system and the length of the housing 1. In assembling the repeater the left hand bulkhead 2 is pre-assembled with the modular assemblies joined together and then inserted into the housing. The right hand end is then completed by making the necessary splices between tail fibres and power feed connections, and the right hand bulkhead is then secured and sealed in place. In repairing a repeater the left hand bulkhead can be removed complete with modular assemblies and there is enough coiled length in the fibres and power feed at the right-hand end to enable the left hand bulkhead with assemblies attached to be completely withdrawn.

The embodiment described has the advantage of three distinct levels of sealing the opto-electronics from the hostile environment of the ocean bed; there are two seals through the bulkhead and a further seal through the individual regenerator module or power module. A further advantage is the flexibility in design—an additional modular assembly can simply be added for each fibre pair of the system without the need to design a different repeater for each system. It also has the distinct advantage of enabling individual pressure testing of each seal and of electrically and optically testing each module prior to assembly. The individual modules are inherently self screening so that electronics of each module are well screened from other modules.

Figure 3:
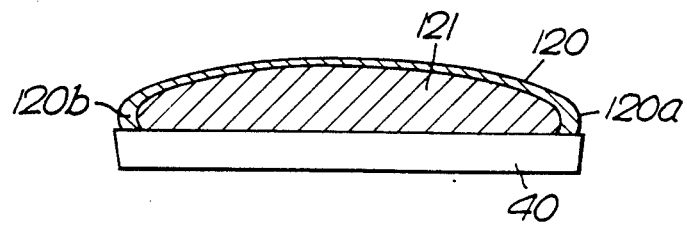
FIG. 3 shows an alternative heat transfer device according to another embodiment of the invention.

The heat transfer devices described could be modified as shown in FIG. 3. A thin flexible metallic band 120 with a width corresponding to the length of the slats 44 and has a shape the same as the surface area presented by the outward facing surfaces of the slats 44. In this modification the slats 44 are replaced by a resilient material 121 so as to urge the band 120 outwardly to resiliently embrace the inside surface of the repeater housing 1. The insulator 40 remains the same as in the embodiment shown in FIG. 2. The ends of the band 120 would be fixed to a metal channel member similar to the member 43 in FIG. 2 but without the slots 42 as these would be unnecessary.

The band 120 is thicker at the ends 120a and 120b than in the middle to ensure good heat conduction toward the central portion which contacts the housing 1.

Figure 4:
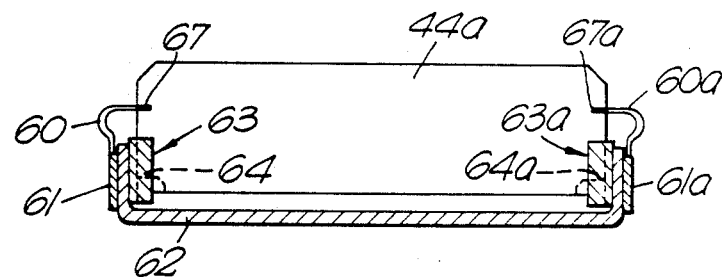
FIG. 4 shows yet another alternative according to a further embodiment.

A further modification to the heat transfer device is illustrated in FIG. 4. This embodiment is similar to the device 30 shown in FIGS. 2 and 2A except that the springs 47 underneath the slats 44 have been replaced by resilient side springs 60 and 60a. Side springs 60 and 60a are formed from a strip 61, 61a which extends along and is secured to the side of the channel member 62, similar to member 43 in FIG. 2. Secured to the inside walls of channel member 62 are guide members 63 and 63a defining upright channels 64 and 64a in which the edges 65 and 65a of slats 44a are guided.

Springs 60 and 60a are secured at their tips in slats 67, 67a in the edges of the slats.

The side springs, channel member and guide members are made of heat conductive materials such as brass and copper, and the springs of e.g. berillium copper.

In all embodiments described the electrical insulation provided by the heat transfer devices has to be in the region of 20K. Volts. Furthermore it is to be noted that the contact between the heat transfer devices and the pressure resistant housing consists of at least two longitudinal edge contacts for each slat 44 (FIG. 4) or surface contact in the case of the metal band 120 (FIG. 3). In practice the slat surface between the longitudinal edges of each slat virtually provides surface contact owing to the microscopic size of the gap which will in practice occur.

We claim:

1. A digital repeater comprises an outer housing, a chassis within the housing, electrical and opto-electronic components supported on the chassis, said chassis being at a d.c. level diffrent from that of the housing while the repeater is in use, and a plurality of heat transfer arrangements which, when the repeater is in use, transfer heat between the chassis and the housing, each said heat transfer arrangement comprising an electrically insulating heat transfer device able to maintain electrical insulation between the chassis and the housing at a voltage of several thousand volts, and a resiliently-biased metallic element, said insulating hear transfer device being located between the chassis and said resiliently-biassed metallic element and comprising an open-box-shaped heat conductive insulator, said metallic element protruding above and in good heat-transfer-connection with said insulator.

2. A repeater as claimed in claim 1, each metallic element comprising a flexible metal band, and means for outwardly biassing the band, said band adapting to the internal contour of the repeater housing.

3. A repeater as claimed in claim 1, each said device comprising a plurality of metal slats and biassing means biassing said slats into engagement with the housing.

4. A repeater as claimed in claim 3, said biassing means comprising flexible resilient leaf springs, each slat having ends secured to the springs, the springs providing a heat conduction path between the insulator and the slat.

5. A repeater as claimed in claim 3, comprising a channel-shaped member secured in the box-like insulator, and slots in the channel-shaped member, each said slat being slidingly mounted at its ends in the slots.

6. A repeater as claimed in claim 5, wherein said biassing means comprises compression springs beneath the slats.

* * * * *